(12) United States Patent
Fujitani (10) Patent No.: US 7,359,422 B2
(45) Date of Patent: Apr. 15, 2008

(54) SEMICONDUCTOR LASER DEVICE AND ILLUMINATION APPARATUS

(75) Inventor: Tetsuya Fujitani, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 308 days.

(21) Appl. No.: 10/989,727

(22) Filed: Nov. 17, 2004

(65) Prior Publication Data

US 2005/0152421 A1    Jul. 14, 2005

(30) Foreign Application Priority Data

Nov. 18, 2003  (JP) ............................. 2003-388597
Nov. 12, 2004  (JP) ............................. 2004-328470

(51) Int. Cl.
*H01S 3/08*    (2006.01)
*H01J 5/16*    (2006.01)

(52) U.S. Cl. ...................... 372/92; 313/113; 313/116

(58) Field of Classification Search ................ 372/92; 313/112–116; 362/84
See application file for complete search history.

(56) References Cited

U.S. PATENT DOCUMENTS 5,813,753 A * 9/1998 Vriens et al. ............... 362/293
6,294,800 B1 * 9/2001 Duggal et al. ................ 257/89
6,583,932 B1 * 6/2003 George et al. .............. 359/566
6,614,170 B2 * 9/2003 Wang et al. ................ 313/498
6,686,676 B2 * 2/2004 McNulty et al. ........... 313/112
7,029,935 B2 * 4/2006 Negley et al. ................ 438/29
7,083,490 B2 * 8/2006 Mueller et al. ............... 445/24
7,091,653 B2 * 8/2006 Ouderkirk et al. .......... 313/113
7,168,834 B2 * 1/2007 Takeda et al. .............. 362/510
7,210,977 B2 * 5/2007 Ouderkirk et al. ........... 445/24
2002/0180351 A1 * 12/2002 McNulty et al. ........... 313/512
2004/0150991 A1 * 8/2004 Ouderkirk et al. .......... 362/231

FOREIGN PATENT DOCUMENTS

JP    5-27121    2/1993
JP    7-192517   7/1995
JP    61-288479  12/1996

* cited by examiner

*Primary Examiner*—Minsun Oh Harvey
*Assistant Examiner*—Phillip Nguyen
(74) *Attorney, Agent, or Firm*—Nixon & Vanderhye P.C.

(57) ABSTRACT

A semiconductor laser device is provided, which comprises a semiconductor laser element having a light emission surface, a reflective member having a reflective surface, and a light diffusing member provided between the light emission surface and the reflective surface. The light emission surface and the reflective surface face each other so that an external resonance cavity is provided therebetween. Scattered light is emitted from the light diffusing member.

25 Claims, 5 Drawing Sheets

FIG.1

Internal resonance cavity  External resonance cavity

SEMICONDUCTOR LASER DEVICE AND ILLUMINATION APPARATUS

This nonprovisional application claims priority under 35 U.S.C. §119(a) on Patent Application No. 2003-388597 filed in Japan on Nov. 18, 2003, and Patent Application No. 2004-328470 filed in Japan on Nov. 12, 2004, the entire contents of which are hereby incorporated by reference.

BACKGROUND OF THE INVENTION

1. Field of the Invention

The present invention relates to a semiconductor laser device and an illumination apparatus using the same.

2. Description of the Related Art

Semiconductor laser devices are used in, for example, light source apparatuses, illumination apparatuses and the like. A semiconductor laser element is provided with a light diffusing member at a light emitting portion thereof so that a scattered light is obtained (FIG. 9).

Figure 9:
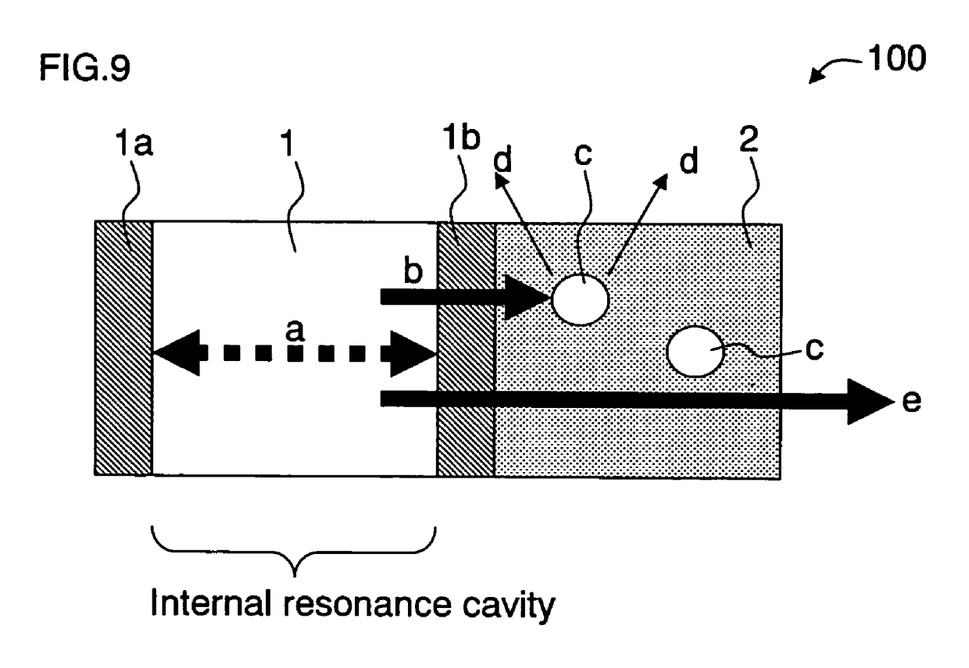
FIG. 9 is a cross-sectional view schematically showing an outline exemplary structure of a conventional semiconductor laser device.

FIG. 9 is a cross-sectional view schematically showing an outline exemplary structure of a conventional semiconductor laser device.

As shown in FIG. 9, a semiconductor laser device 100 comprises a semiconductor laser element 1 and a light diffusing member 2.

In the semiconductor laser element 1, an internal resonance cavity is provided between a light emission surface 1b and a counter surface 1a which serve as reflective mirrors. Light a oscillates between the two surfaces to form a laser. Laser emission light b emitted from the light emission surface 1b is input to the light diffusing member 2.

The light diffusing member 2 comprises a base material, such as a resin or the like, which contains a scattering material c, such as air bubbles or microparticles (e.g., graphite, carbon, platinum, alumina, etc.). The incoming light b is scattered by the scattering material C, and is emitted as light d from a side surface of the light diffusing member 2 to the outside.

For example, Japanese Laid-Open Publication No. 5-27121 discloses a light source apparatus which comprises an optical fiber and a light source. The optical fiber has a core with a diameter of 0.1 to 5 times the wavelength of the guided light. The optical fiber contains a scattering material. Light emitted by the light source is input to the optical fiber from one end surface thereof. Light scattered in the optical fiber is taken out from a side surface of the optical fiber.

Japanese Laid-Open Publication No. 61-288479 discloses a semiconductor laser device comprising a semiconductor element and a semiconductor laser element. A side surface of the semiconductor element faces parallel to a laser light emitting facet of the semiconductor laser element with a distance of several millimeters or less therebetween. The side surface of the semiconductor element is a cleavage plane and at least a portion thereof is covered with a dielectric reflective film which feeds laser light back to the semiconductor laser element.

Japanese Laid-Open Publication No. 7-192517 discloses an illumination apparatus for roadway guidance of a vehicle. The apparatus is a long-length illumination means comprising a light source and a linear light transmission means connected thereto. Light transmitted through the light transmission means is scattered continuously or intermittently along the line. The apparatus is embedded in a trench formed in a road.

In the conventional semiconductor laser device of FIG. 9, however, light e passing through the light diffusing member 2 cannot be used as scattered light d, resulting in low light emission efficiency.

Also in the conventional light source apparatus of Japanese Laid-Open Publication No. 5-27121 and the illumination apparatus for roadway guidance of a vehicle of Japanese Laid-Open Publication No. 7-192517, light passing through the optical fiber cannot be used as illumination light, resulting from low light emission efficiency. Moreover, these light source apparatuses and the illumination apparatus for roadway guidance of a vehicle do not use an external resonance cavity. Therefore, the laser light is not efficiently used.

The semiconductor laser device of Japanese Laid-Open Publication No. 61-288479 mainly functions as a light detector. A portion of light emitted from a rear surface of the semiconductor laser element is used for light detection, and the remaining light is fed back to the semiconductor laser element by a reflective film. However, no light diffusing member is provided at the semiconductor laser element side. Therefore, scattered light for external emission does not occur. It cannot be said that light is efficiently used for external emission.

SUMMARY OF THE INVENTION

According to an aspect of the present invention, a semiconductor laser device is provided, which comprises a semiconductor laser element having a light emission surface, a reflective member having a reflective surface, and a light diffusing member provided between the light emission surface and the reflective surface. The light emission surface and the reflective surface face each other so that an external resonance cavity is provided therebetween, and scattered light is emitted from the light diffusing member.

In one embodiment of this invention, the light emission surface is interposed between the semiconductor laser element and the light diffusing member, and the light diffusing member contains a light scattering material.

In one embodiment of this invention, the light diffusing member contains at least one of a fluorescent material and a wavelength conversion material.

In one embodiment of this invention, the fluorescent material is capable of absorbing light from the semiconductor laser element and emitting light having a wavelength different from the wavelength of the light from the semiconductor laser element.

In one embodiment of this invention, the fluorescent material contains a plurality of substances capable of emitting light having different wavelengths.

In one embodiment of this invention, the wavelength conversion material is capable of absorbing light from the semiconductor laser element and converting the light from the semiconductor laser element into light having a wavelength which is 1/a natural number of the wavelength of the light from the semiconductor laser element.

In one embodiment of this invention, the wavelength conversion material is a second harmonic generation element.

In one embodiment of this invention, an oscillation wavelength of the semiconductor laser element is in a blue region, a light emission color of the fluorescent material is yellow, and light obtained by diffusing light from the semiconductor laser element using the light diffusing member is mixed with light emitted from the fluorescent material to obtain white light.

In one embodiment of this invention, an oscillation wavelength of the semiconductor laser element is in a red region, a wavelength of laser light emitted from the wavelength conversion material is in an ultraviolet region, and light obtained by diffusing light from the semiconductor laser element using the light diffusing member is mixed with light emitted from the fluorescent material.

In one embodiment of this invention, an oscillation wavelength of the semiconductor laser element is in an infrared region, a wavelength of laser light emitted from the wavelength conversion material is in a blue region, and light obtained by diffusing light emitted from the wavelength conversion material using the light diffusing member is mixed with light emitted from the fluorescent material.

In one embodiment of this invention, the semiconductor laser element further has at least one light emission surface. At least one reflective member is further provided, a reflective surface of each reflective member being disposed facing a corresponding light emission surface of the semiconductor laser element. A plurality of external resonance cavities are provided between the light emission surfaces of the semiconductor laser elements and the reflective surfaces of the reflective members.

In one embodiment of this invention, the semiconductor laser element is in the shape of a hexagon when viewed from the top. The light emission surfaces are disposed on six outer circumferential sides of the hexagon. The reflective members each having the reflective surface provided thereon, the reflective surface facing the corresponding light emission surface. The external resonance cavities are provided between the light emission surfaces and the reflective surfaces.

In one embodiment of this invention, the six external resonance cavities are paired with each pair of external resonance cavities facing each other. The light diffusing members corresponding to the three pairs of external resonance cavities emit three primary colors, red, blue and green, respectively.

In one embodiment of this invention, the semiconductor laser device further comprises a second semiconductor laser element disposed opposite to the light diffusing member with respect to the reflective member. The reflective member also serves as a light emission surface for the second semiconductor laser element. The light emission surface of the first semiconductor laser element also functions as a reflective surface.

In one embodiment of this invention, the light diffusing member is made of a resin containing a light scattering material. The resin seals the semiconductor laser element and the reflective member.

In one embodiment of this invention, the light diffusing member has a light emission surface in the shape of a lens.

In one embodiment of this invention, the semiconductor laser device further comprises an external reflective member for reflecting light emitted from the light diffusing member in a predetermined direction.

In one embodiment of this invention, the external reflective member is a reflective condensing member for reflecting and condensing the light emitted from the laser diffusing member.

In one embodiment of this invention, the semiconductor laser device further comprises a drive circuit for driving the semiconductor laser element.

In one embodiment of this invention, a power source voltage for the drive circuit is any one of DC 12 V, DC 24 V and AC 100 V.

In one embodiment of this invention, a power source terminal of the drive circuit is in the shape of a base.

In one embodiment of this invention, the light diffusing member is made of a resin containing a light scattering material and the light diffusing member is formed by applying the resin on the light emission surface of the semiconductor laser element.

In one embodiment of this invention, the light diffusing member is made of a resin containing a light scattering material and the light diffusing member is formed by applying the resin onto the reflective surface of the reflective member.

In one embodiment of this invention, the semiconductor laser device further comprises a light reception element for receiving light emitted from the light diffusing member. Information about the light received by the light reception element is fed back to the drive circuit so that an intensity of the light emitted from the light diffusing member is controlled.

According to another aspect of the present invention, an apparatus for illumination is provided, which comprises the above-described semiconductor laser device. Illumination is performed using light emitted from the semiconductor laser device.

Hereinafter, functions and effects of the present invention will be described.

In the present invention, the light diffusing member is disposed in the external resonance cavity provided between the light emission surface of the semiconductor laser element and the reflective surface of the reflective member. Thereby, light which is not scattered by the light diffusing member can be returned to the light diffusing member by the reflective material. As a result, the amount of light which is emitted without contribution to scattered light can be reduced, thereby making it possible to improve light use efficiency.

By adding a fluorescent material to the light diffusing member or using an SHG element (e.g., a wavelength conversion element, etc.) as the light diffusing member, scattered light having a wavelength different from that of laser light can be obtained. By providing a plurality of external resonance cavities, scattered light having a plurality of colors can be obtained.

Another semiconductor laser element may be further provided, where the light emission surface thereof also serves as a reflective surface of the reflective member. In this manner, two semiconductor laser elements may be provided. In this case, even if one of the semiconductor laser elements is out of order, laser oscillation can be still be performed by the other semiconductor laser element.

A resin containing a light scattering material may be used as the light diffusing member. By sealing the semiconductor laser element and the reflective member with the resin, a packaged semiconductor laser device provided with the light diffusing member can be fabricated without increasing the steps of the fabrication process.

By shaping the light emission surface of the light diffusing member into a lens, a light condensing effect can be obtained. Alternatively, by providing an external reflective member for condensing light at a position where the external reflective member can be irradiated with light from the light diffusing member, scattered light can be condensed in an arbitrary direction (predetermined direction).

By providing a drive circuit for driving a semiconductor laser element in the semiconductor laser device, the semiconductor laser device can be driven only by supplying a power source voltage thereto.

By setting the power source voltage of the drive circuit to DC 12 V or DC 24 V, the semiconductor laser device can be used as a lamp for an automobile or the like. Alternatively, by setting the power source voltage of the drive circuit to AC 100 V which is a commercial power source, the semiconductor laser device can be used as a fluorescent tube or a light bulb. In addition, by shaping the power source terminal of the drive circuit into a base, the semiconductor laser device can be handled in a manner similar to that of light bulbs (illumination apparatuses and light source apparatuses).

By applying a resin containing a light scattering material onto the light emission surface of the semiconductor laser element and/or the reflective surface of the reflective member, the light diffusing member can be easily provided on the light emission surface of the semiconductor laser element and/or the reflective surface of the reflective member.

By providing a light reception element at a position which allows reception of light from the light diffusing member, light information obtained from by the light reception element can be fed back to the drive circuit. Thereby, the intensity of light emitted from the light diffusing member can be controlled, resulting in stable scattered light.

According to the present invention, a light diffusing member is provided in an external resonance cavity between a light emission surface of a semiconductor laser element and a reflective surface of a reflective member. Thereby, laser light can be efficiently converted to scattered light. Thus, a semiconductor laser device having high light use efficiency can be achieved.

Thus, the invention described herein makes possible the advantages of providing a semiconductor laser device, in which light passing through a light diffusing member is efficiently reused, thereby significantly increasing light emission efficiency, and an illumination apparatus using the same.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Embodiment 1

Figure 1:
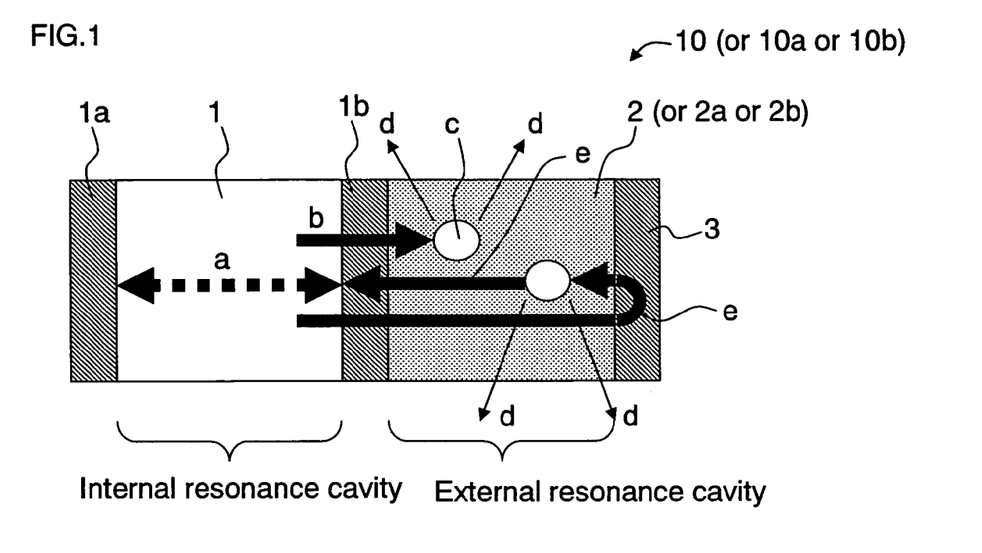
FIG. 1 is a cross-sectional view schematically showing an outline exemplary structure of a semiconductor laser device according to Embodiment 1 of the present invention.

FIG. 1 is a cross-sectional view schematically showing an outline exemplary structure of a semiconductor laser device according to Embodiment 1 of the present invention.

As shown in FIG. 1, the semiconductor laser device 10 comprises a semiconductor laser element 1, a light diffusing member 2 and a reflective member 3.

In the semiconductor laser element 10, an internal resonance cavity is provided between a light emission surface 1b and a counter surface 1a which serve as reflective mirrors. Light a oscillates between the two surfaces to form the laser. Laser emission light b emitted from the light emission surface 1b is input to the light diffusing member 2.

The light diffusing member 2 comprises a base material, such as a resin or the like, which contains a scattering material c, such as air bubbles or microparticles (e.g., graphite, carbon, platinum, alumina, etc.). The incoming light b is scattered in the light diffusing member 2, and is emitted as light d from a side surface of the light diffusing member 2 to the outside.

The above-described features are the same as those of conventional technology. In the semiconductor laser device 10 of Embodiment 1, a reflective surface (e.g., a reflective mirror, etc.) of the reflective member 3 is disposed facing the light emission surface 1b of the semiconductor laser element 1. An external resonance cavity (light diffusing member 2) is provided between the light emission surface 1b and the reflective member 3. Thus, the light diffusing member 2 is provided between the semiconductor laser element 1 and the reflective member 3.

With the above-described structure, light e which has passed through the light diffusing member 2 is reflected by the reflective member 3 back to the light diffusing member 2. The light travels through the light diffusing member 2 again and is split into scattered light d and transmitted light e. The transmitted light e on the return path passes through the light emission surface 1b and comes back to the internal resonance cavity 1, and is reused as exited light for laser oscillation without waste (efficiently).

As the reflectances of the light emission surface 1b and the counter surface 1a of the semiconductor laser element 1 approach 100%, the light use efficiency is increased.

In Embodiment 1, by adding a fluorescent material to the light diffusing member 2 or using a second harmonic generation (SHG) element as the light diffusing member 2, it is possible to obtain scattered light having a wavelength different from the wavelength of laser light emitted by the semiconductor laser element 1. For example, by combining laser light in a 400-nm band and a fluorescent material which converts ultraviolet light to white light, widely applicable white light can be obtained.

Embodiment 2

In Embodiment 2 of the present invention, a light diffusing member contains a scattering material as well as a fluorescent material.

A semiconductor laser device 10a of Embodiment 2 has substantially the same structure as that of Embodiment 1 of FIG. 1, except for a light diffusing member 2a which contains a scattering material c as well as a fluorescent material.

The fluorescent material absorbs light from a semiconductor laser element 1 and emits light having a wavelength different from that of light from the semiconductor laser element 1.

In this case, an oscillation wavelength of the semiconductor laser element 1 is in a blue region, while the color of light emitted from the fluorescent material is yellow. By mixing light obtained by diffusing light from the semiconductor laser element 1 using the light diffusing member 2a with light emitted by the fluorescent material, white scattered light can be emitted.

For example, the oscillation wavelength of the semiconductor laser element 1 is 460 nm (blue), the scattering material c is $SiO_2$ microparticle (average grain diameter: 0.5 µm), and the fluorescent material is Ce-doped YAG (light emission color: yellow). In this case, light emitted to the outside of the laser resonance cavity has a white color.

Although not particularly specified in Embodiment 2, the fluorescent material may include a plurality of substances which emit light having different wavelengths.

Also in Embodiment 2, the light diffusing member 2a contains the scattering material c as well as the fluorescent material. The present invention is not limited to this. Alternatively, the light diffusing member 2a may contain the fluorescent material instead of the scattering material c.

Embodiment 3

In Embodiment 3 of the present invention, a light diffusion member contains a fluorescent material and a wavelength conversion material in addition to a scattering material.

The semiconductor laser device 10b of Embodiment 3 has substantially the same structure as that of Embodiment 1, except for a light diffusing member 2b comprising a scattering material c as well as a fluorescent material and an SHG element as a wavelength conversion material.

The wavelength conversion material absorbs light from the semiconductor laser element 1 and converts it to light having a wavelength which is 1/a natural number (mainly ½) of the wavelength of light emitted from the semiconductor laser element 1.

In this case, the oscillation wavelength of the semiconductor laser element 1 is in a red region, while laser light emitted by the wavelength conversion material is in an ultraviolet region. Light, which is emitted by the semiconductor laser element 1 and is then diffused by the light diffusing member, is mixed with light emitted from the wavelength conversion material. Light emitted by the wavelength conversion material is removed since the light is not visible. Ultraviolet light is harmful to humans. Therefore, ultraviolet light needs to be absorbed by a fluorescent material. Further, ultraviolet light needs to be prevented from being radiated to the outside by covering the laser device with a material, such as a resin or the like, capable of absorbing ultraviolet light.

For example, the oscillation wavelength of the semiconductor laser device 10b is 650 nm (red), the SHG element (wavelength conversion material) is made of β-BBO (barium borate) powder, the scattering material c is $SiO_2$ microparticle (average grain diameter: 0.7 µm), the fluorescent material is Eu-doped $BaMgAl_{10}O_{17}$ (light emission color: blue) and Eu-doped $SrAl_2O_4$ (light emission color: green). The wavelength of the second harmonic wave generated in the laser resonance cavity is 325 nm (ultraviolet light). Light emitted to the outside of the laser resonance cavity has a white color.

Although not particularly specified in Embodiment 3, alternatively, the oscillation wavelength of the semiconductor laser element 1 may be in an infrared region, the wavelength of laser light emitted by the wavelength conversion material may be in a blue region, and light which is emitted by the wavelength conversion material and diffused by the light diffusing member may be mixed with light emitted by the fluorescent material. Light emitted from the semiconductor laser element 1 is not visible and therefore is removed. Further, the light is absorbed by the wavelength conversion material and therefore the intensity thereof is weak.

In Embodiment 2, the light diffusing member contains a fluorescent material. In Embodiment 3, the light diffusing member contains a scattering material c, a fluorescent material and a wavelength conversion material. The present invention is not limited to this. The light diffusing member may contain only a wavelength conversion material. Alternatively, the light diffusing member may contain a fluorescent material and a wavelength conversion material. Alternatively, the light diffusing member may contain a scattering material c and a wavelength conversion material.

Embodiment 4

In Embodiment 4 of the present invention, a semiconductor laser element is provided with a plurality of (e.g., six) external resonance cavities. Each cavity has a light emission surface and a reflective surface which face each other.

Figure 2:
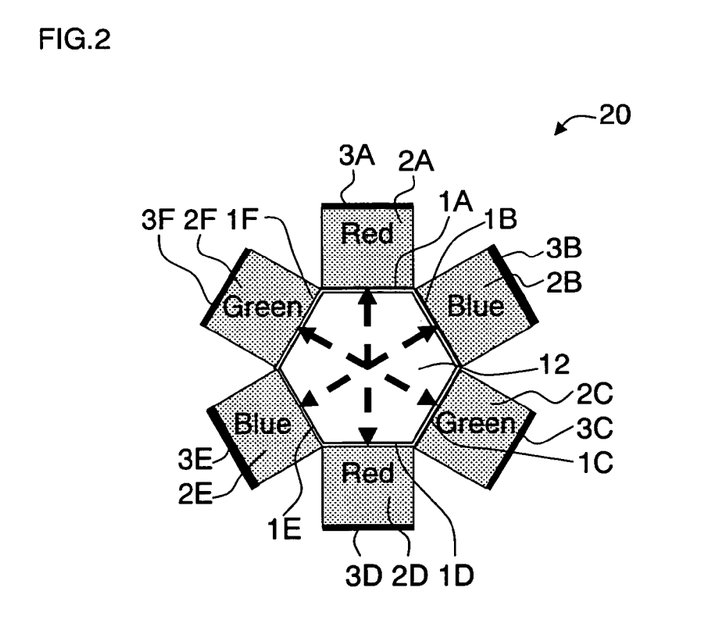
FIG. 2 is a cross-sectional view schematically showing an outline exemplary structure of a semiconductor laser device according to Embodiment 4 of the present invention.

FIG. 2 is a cross-sectional view schematically showing an outline exemplary structure of a semiconductor laser device according to Embodiment 4 of the present invention.

As shown in FIG. 2, the semiconductor laser device 20 is provided with six external resonance cavities, which are composed of a semiconductor laser element 12, in which light can be taken out from the six light emission surfaces 1A to 1F, and six reflective members 3A to 3F (reflective mirrors). A light diffusing member 2A is disposed between the light emission surface 1A and the reflective member 3A. A light diffusing member 2B is disposed between the light emission surface 1B and the reflective member 3B. A light diffusing member 2C is disposed between the light emission surface 1C and the reflective member 3C. A light diffusing member 2D is disposed between the light emission surface 1D and the reflective member 3D. A light diffusing member 2E is disposed between the light emission surface 1E and the reflective member 3E. A light diffusing member 2F is disposed between the light emission surface 1F and the reflective member 3F.

In the semiconductor laser device 20 of Embodiment 4, two light emission surfaces (e.g., 1A and 1D, 1B and 1E, 1C and 1F) of the semiconductor laser element 12 are paired. Light emission of the three pairs of light emission surfaces can be separately switched ON/OFF. By causing light diffusing members provided in these three external resonance cavities (3A and 3D, 3B and 3E, 3C and 3F) to emit light having three primary colors (i.e., red, blue and green), a full-color laser illumination apparatus can be achieved.

In Embodiment 4, a semiconductor laser element is provided with six light emission surfaces on the outer circumferential sides of a hexagon, which is the shape of the semiconductor laser element when viewed from the top. Six reflective members each having a reflective surface are disposed facing the respective light emission surfaces. The light emission surfaces of the semiconductor laser element and the reflective surfaces of the reflective members provide six external resonance cavities. A six light diffusing member is provided in each space between the six light emission surfaces and the six reflective members. Scattered light is emitted from the light diffusing members. The present invention is not limited to this. The number of external resonance cavities is not limited to six and may be any plural number. A semiconductor laser element may be provided with a plurality of light emission surfaces. A plurality of reflective members each having a reflective surface may be disposed facing the respective light emission surfaces. The light emission surfaces of the semiconductor laser element and the reflective surfaces of the reflective members may provide a plurality of external resonance cavities.

Embodiment 5

In Embodiment 5 of the present invention, another semiconductor laser element is provided opposite to the light diffusing member 2 with respect to of the reflective member 3. The reflective member 3 also functions as a light emission surface for the other semiconductor laser element. The light emission surface 1b of the semiconductor laser element 1 facing the reflective member 3 also functions as a reflective surface.

Figure 3:
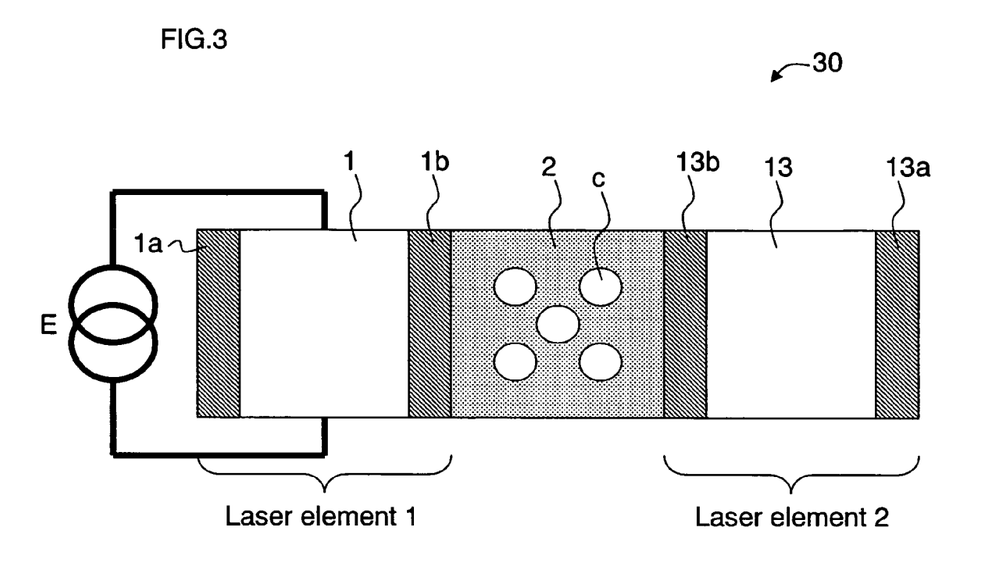
FIG. 3 is a cross-sectional view schematically showing an outline exemplary structure of a semiconductor laser device according to Embodiment 5 of the present invention.

FIG. 3 is a cross-sectional view schematically showing an outline exemplary structure of a semiconductor laser device according to Embodiment 5 of the present invention.

As shown in FIG. 3, the semiconductor laser device 30 is provided with two semiconductor laser elements 1 and 13 which face each other and a light diffusing member 2 provided between light emission surfaces 1b and 13b of the semiconductor laser element 1 and 13.

In the semiconductor laser device 30 of Embodiment 5, the semiconductor laser element 1 is connected to a power source E and is used as a laser light source, while the light emission surface 13b of the semiconductor laser element 13 is used as a reflective member. As a result, an external resonance cavity is formed between the light emission surface 1b of the semiconductor laser element 1 and the light emission surface 13b of the semiconductor laser element 13.

Even if the semiconductor laser element 1 which is used as a laser light source is out of order and no longer performs laser oscillation, the semiconductor laser element 1 can be used as a reflective member while the light emission surface 1b serves as a reflective surface. By using the semiconductor laser element 13, which is originally used as a reflective member, as a laser light source, the life of the semiconductor laser device 30 can be doubled.

Embodiment 6

In Embodiment 6 of the present invention, a light diffusing member made of a resin containing a light scattering material seals a semiconductor laser element 1 and a reflective member 3.

Figure 4:
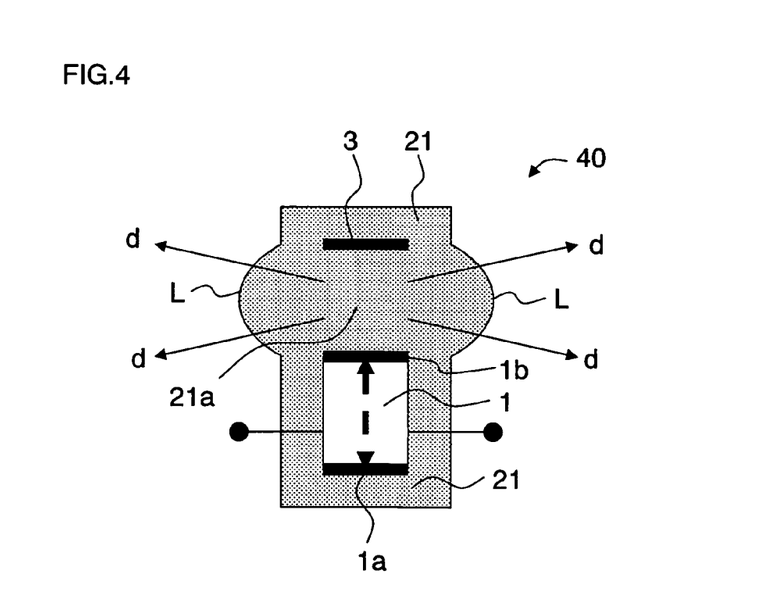
FIG. 4 is a cross-sectional view schematically showing an outline exemplary structure of a semiconductor laser device according to Embodiment 6 of the present invention.

FIG. 4 is a cross-sectional view schematically showing an outline exemplary structure of a semiconductor laser device according to Embodiment 6 of the present invention.

As shown in FIG. 4, the semiconductor laser device 40 comprises a semiconductor laser element 1 and a reflective member 3, which are sealed in a resin 21 containing a light scattering material.

In this case, with a single step, it is possible to package the semiconductor laser device 40 and form a light diffusing member 21a between the semiconductor laser element 1 and the reflective member 3.

In addition, when the light scattering material-containing resin constituting the light diffusing member 21 is formed so that a surface L from which light is emitted is in the shape of a lens (e.g., a curved surface of a convex lens), an effect of condensing scattered light d can be achieved.

In Embodiment 6, the semiconductor laser element 1 and the reflective member 3 are sealed with a resin. This technique can be applied to the semiconductor laser device 20 having a plurality of external resonance cavities as described in Embodiment 4 and the semiconductor laser device 30 comprising the two semiconductor laser elements 1 and 13, the light emission surface of one of which is used as a reflective member, as described in Embodiment 5.

In Embodiment 6, a resin constituting the light diffusing member 21a is shaped into a lens. This technique can be applied to the semiconductor laser device 10, 10a or 10b, in which the light diffusing member 2, 2a or 2b is disposed between the semiconductor laser element 1 and the reflective member 3 as described in Embodiments 1 to 3. The technique can also be applied to a semiconductor laser device 60, in which a light diffusing member is formed by applying a resin onto the semiconductor laser element 1 or the reflective member 3 as described below in Embodiment 9.

Embodiment 7

In Embodiment 7 of the present invention, a reflective condensing member is provided as an external reflective member which reflects light emitted by a light diffusing member 2 toward a predetermined direction.

Figure 5:
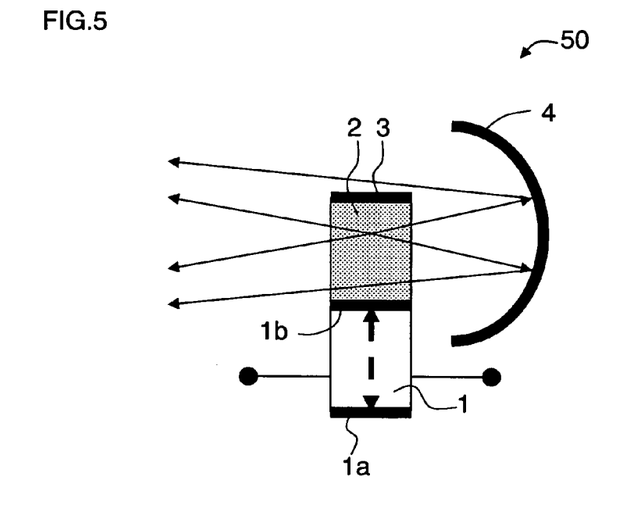
FIG. 5 is a cross-sectional view schematically showing an outline exemplary structure of a semiconductor laser device according to Embodiment 7 of the present invention.

FIG. 5 is a cross-sectional view schematically showing an outline exemplary structure of a semiconductor laser device according to Embodiment 7 of the present invention.

As shown in FIG. 5, a semiconductor laser device 50 is provided with a second reflective member 4 (reflective condensing member) made of a reflective plate or the like at a position where the second reflective member 4 is irradiated with light from a light diffusing member 2.

With the second reflective material 4, scattered light can be condensed into an arbitrary direction. Therefore, the semiconductor laser device 50 of the present invention can be applied to a flashlight, a backlight for a liquid crystal display, and the like.

The second reflective material 4 used in the semiconductor laser device 50 of Embodiment 7 can be applied to any of Embodiments 1 to 6 and 8 to 10.

Embodiment 8

In Embodiment 8 of the present invention, a drive circuit is provided to drive a semiconductor laser element 1. A power source terminal of the drive circuit is in the shape of a base.

Figure 6A:
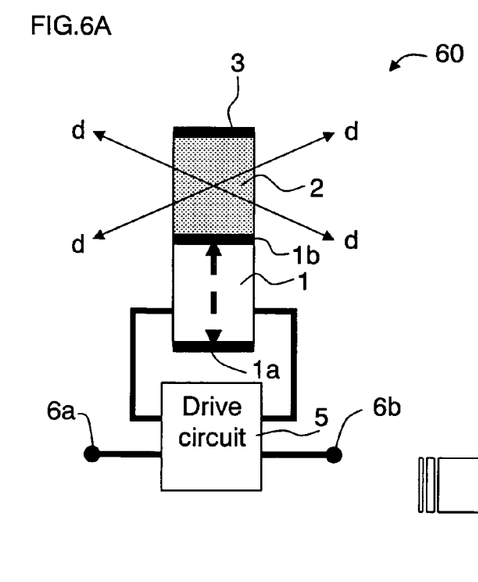
FIG. 6 is a diagram schematically showing an outline exemplary structure of a semiconductor laser device according to Embodiment 8 of the present invention.
Figure 6B:
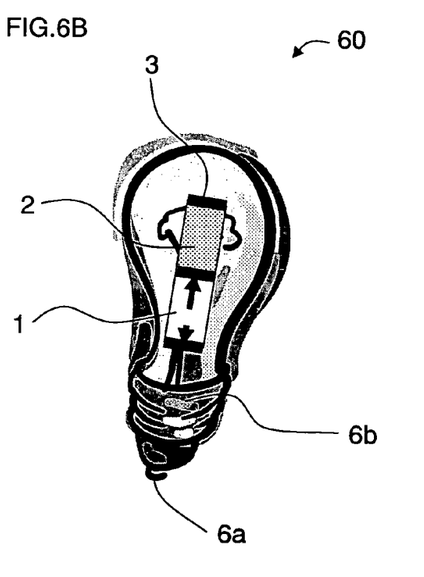

Part (a) of FIG. 6 provides a cross-sectional view schematically showing an outline exemplary structure of a semiconductor laser device according to Embodiment 8 of the present invention. Part (b) of FIG. 6 provides a perspective view of the semiconductor laser device.

As shown in part (a) of FIG. 6, a semiconductor laser device 60 comprises a semiconductor laser element 1, a light diffusing member 2, a reflective member 3, and a drive circuit 5 for driving the semiconductor laser element 1. Scattered light d is emitted to the outside from a side surface of the light diffusing member 2 only by supplying a power source voltage to the semiconductor laser element 1.

As shown in part (b) of FIG. 6, power source terminals 6a and 6b of the drive circuit 5 are shaped into a base similar to that of light bulbs. The semiconductor laser device 60 of the present invention can be used as an illumination apparatus in place of conventional light bulbs. For example, when the drive circuit 5 is adapted to a power source voltage of DC 12 V or DC 24 V, the semiconductor laser device 60 of the present invention can be used as a lamp for automobiles or the like. When the drive circuit 5 is adapted to a power source voltage of AC 100 V or 110 V which are commercial power sources, the semiconductor laser device 60 of the present invention can be used in place of a fluorescent tube or a commercial light bulb.

The base used in the semiconductor laser device 60 of Embodiment 8 can be applied to any of Embodiments 1 to 7 and 9 and 10.

Embodiment 9

In Embodiment 9 of the present invention, in place of the light diffusing member 2, 2a or 2b, another light diffusing member is provided on a light emission surface of a semiconductor laser element 1 or a reflective surface of a reflective member 3 by applying a resin containing a light scattering material thereon.

Figure 7:
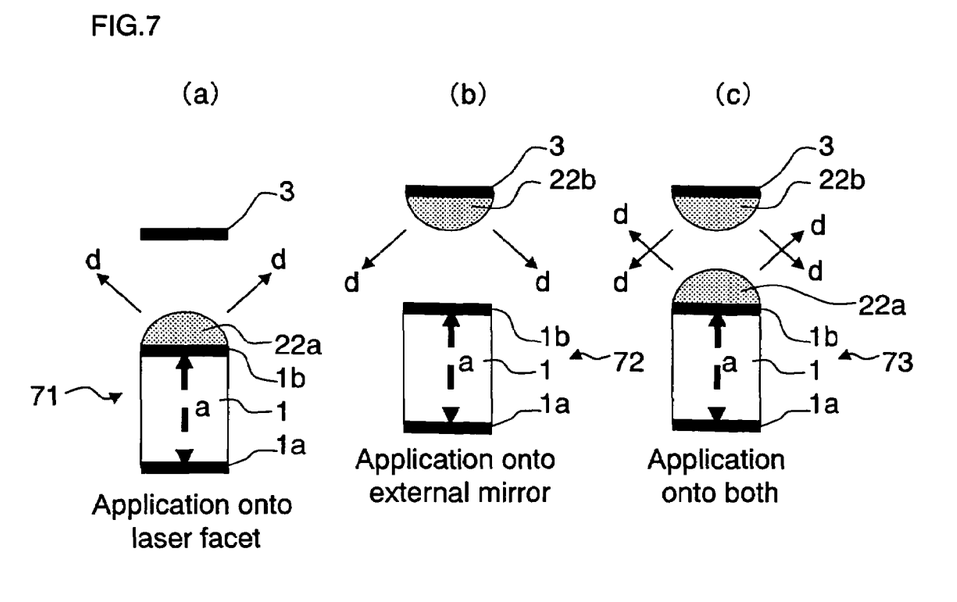
FIGS. 7A to 7C are cross-sectional views schematically showing an outline exemplary structure of a semiconductor laser device according to Embodiment 9 of the present invention.

FIGS. 7A to 7C each provide a cross-sectional view schematically showing an outline exemplary structure of a semiconductor laser device according to Embodiment 9 of the present invention.

As shown in FIG. 7A, the semiconductor laser device 71 is provided with a light diffusing member 22a, which is formed by applying a resin containing a light scattering material on a light emission surface 1b of a semiconductor laser element 1. Scattered light d is emitted from the light diffusing member 22a to the outside.

As shown in FIG. 7B, the semiconductor laser device 72 is provided with a light diffusing member 22b, which is formed by applying a resin containing a light scattering material on a reflective surface of the reflective member 3. Scattered light d is emitted from the light diffusing member 22b to the outside.

As shown in FIG. 7C, the semiconductor laser device 73 is provided with light diffusing members 22a and 22b, which are formed by applying a resin containing a light scattering material onto a light emission surface 1b of a semiconductor laser element 1 and a reflective surface of a reflective member 3. Scattered light d is emitted from the light diffusing members 22a and 22b.

According to Embodiment 9, the light diffusing members 22a and 22b can be formed by application of a resin. The fabrication process of a semiconductor laser device can be simplified.

The light diffusing member of Embodiment 9 used in the semiconductor laser device 70 can be applied to any one of Embodiments 1 to 5, 7, 8 and 10.

Embodiment 10

In Embodiment 10 of the present invention, a light reception element for receiving light emitted from the light diffusing member 2, 2a or 2b is further provided. Information obtained from light received by the light reception element is fed back to a drive circuit to control the intensity of light emission.

Figure 8:
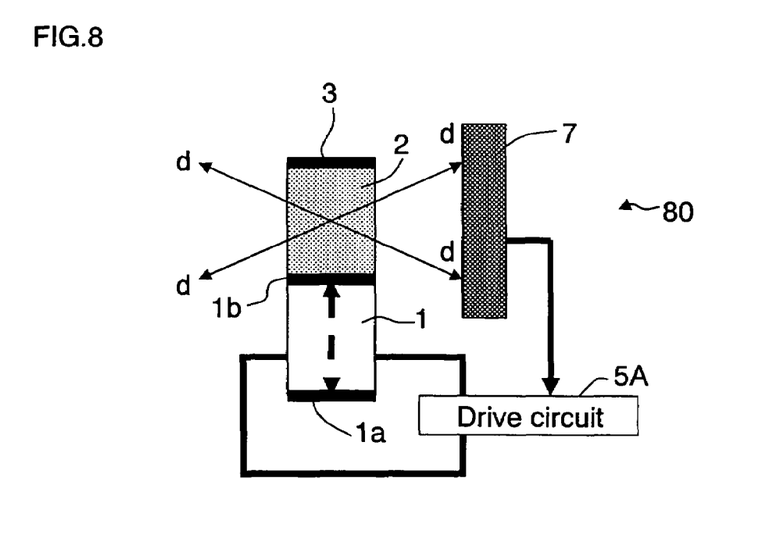
FIG. 8 is a cross-sectional view schematically showing an outline exemplary structure of a semiconductor laser device according to Embodiment 10 of the present invention.

FIG. 8 is a cross-sectional view schematically showing an outline exemplary structure of a semiconductor laser device according to Embodiment 10 of the present invention.

As shown in FIG. 8, the semiconductor laser device 80 comprises a semiconductor laser element 1, a light diffusing member 2, a reflective member 3, a drive circuit 5A for driving the semiconductor laser element 1, and a light reception element 7 disposed at a position which allows reception of light from the light diffusing member 2.

The intensity of scattered light d is detected by the light reception element 7. The intensity information is fed back to the drive circuit 5A to control the drive circuit 5A so that the intensity of the scattered light d is within a predetermined range.

With the above-described structure, in which the light reception element 7 for receiving the scattered light d from the light diffusing member 2 is provided, the intensity of the scattered light d can be stably controlled to be constant or within a predetermined range.

The drive circuit 5A and the light reception element 7 used in the semiconductor laser device 80 of Embodiment 10 can be applied to any one of Embodiments 1 to 9.

According to Embodiments 1 to 10 of the present invention, an external resonance cavity is provided between the light emission surface 1b of the semiconductor laser element 1 and the reflective surface of the reflective member 3 disposed facing the light emission surface 1b of the semiconductor laser element 1. The light diffusing member 2 (or 2a, 2b, 2a to 2F, 21a, 22a, 22b) is provided between the semiconductor laser element 1 and the reflective member 3. Light emitted from the semiconductor laser element 1 is input to the light diffusing member 2 (or 2a, 2b, 2a to 2F, 21a, 22a, 22b) and is scattered by the scattering material c and output as the scattered light d. The light e passing through the light diffusing member 2 (or 2a, 2b, 2a to 2F, 21a, 22a, 22b) is reflected from the reflective member 3 and is returned to the light diffusing member 2 (or 2a, 2b, 2a to 2F, 21a, 22a, 22b). The light passing through the light diffusing member 2 (or 2a, 2b, 2a to 2F, 21a, 22a, 22b) can be reused in the semiconductor laser element 1, resulting in an improvement in light emission efficiency.

In Embodiments 1 and 2, a semiconductor laser element emitting light having a wavelength in an ultraviolet region and a fluorescent material emitting white light are combined to obtain white light. The present invention is not limited to this. Fluorescent materials emitting light having different colors may be included in a light diffusing member. In Embodiments 1 and 3, an SHG element is contained as a wavelength conversion element in a light diffusing member. The present invention is not limited to this. Any material which can convert the wavelength of laser light to a desired different wavelength may be used as a wavelength conversion element in the light diffusing member. In Embodiment 4 (FIG. 2), six external resonance cavities are provided. The present invention is not limited to this. The number of external resonance cavities may be three (odd number) or four (even number) or any plural number. In Embodiment 6 (FIG. 4), a resin which seals the light emission surface of a light diffusing member is shaped into a lens. The present invention is not limited to this. The light emission surface of the light diffusing member of the other embodiments may be shaped into a lens. In Embodiment 7 (FIG. 5), a concave mirror serving as reflective condensing member (external reflective member) is provided at a position which allows the mirror to be irradiated with light from a light diffusing member. The present invention is not limited to this. The mirror may be a planar mirror or a convex mirror. Alternatively, an external member, such as a condensing means (e.g., a convex lens, a concave lens, etc.), may be provided. In Embodiment 8 (FIG. 6), the power source terminal of a drive circuit is in the shape of a base. The present invention is not limited to this. Any power source terminal capable of supplying a power source voltage may be used.

In addition, an illumination apparatus can be obtained, which comprises the semiconductor laser device of any of Embodiments 1 to 10 which can reuse light efficiently to improve light emission efficiency.

According to the present invention, a semiconductor laser device capable of efficiently converting laser light to scattered light can be achieved in the field of semiconductor laser devices which are used in, for example, light source apparatuses, illumination apparatuses and the like. The semiconductor laser device can be widely used for light source apparatuses and illumination apparatuses, such as lamps for automobiles, fluorescent lamps and light bulbs, flashlights and backlights for liquid crystal displays, and the like. In addition, a full color illumination apparatus can be achieved.

Although certain preferred embodiments have been described herein, it is not intended that such embodiments be construed as limitations on the scope of the invention except as set forth in the appended claims. Various other modifications and equivalents will be apparent to and can be readily made by those skilled in the art, after reading the description herein, without departing from the scope and spirit of this invention. All patents, published patent applications and publications cited herein are incorporated by reference as if set forth fully herein.

What is claimed is:

1. A semiconductor laser device, comprising:
   a semiconductor laser element having a light emission surface;
   a reflective member having a reflective surface; and
   a light diffusing member provided between the light emission surface and the reflective surface,
   wherein the light emission surface and the reflective surface face each other so that an external resonance cavity is provided therebetween, and wherein the external resonance cavity is in direct contact with each of the light emission surface and the reflective surface, and
   scattered light is emitted from the light diffusing member.

2. A semiconductor laser device according to claim 1, wherein
   the light emission surface is interposed between the semiconductor laser element and the light diffusing member, and
   the light diffusing member contains a light scattering material.

3. A semiconductor laser device according to claim 1, wherein the light diffusing member contains at least one of a light scattering material, a fluorescent materials, and a wavelength conversion material.

4. A semiconductor laser device according to claim 3, wherein the fluorescent material is capable of absorbing light from the semiconductor laser element and emitting light having a wavelength different from the wavelength of the light from the semiconductor laser element.

5. A semiconductor laser device according to claim 3, wherein the fluorescent material contains a plurality of substances capable of emitting light having different wavelengths.

6. A semiconductor laser device according to claim 3, wherein the wavelength conversion material is capable of absorbing light from the semiconductor laser element and converting the light from the semiconductor laser element to light having a wavelength which is 1/N of the wavelength of the light from the semiconductor laser element, wherein N is a natural number.

7. A semiconductor laser device according to claim 3, wherein the wavelength conversion material is a second harmonic generation element.

8. A semiconductor laser device according to claim 3, wherein an oscillation wavelength of the semiconductor laser element is in a blue region, a light emission color of the fluorescent material is yellow, and light obtained by diffusing light from the semiconductor laser element using the light diffusing member is mixed with light emitted from the fluorescent material to obtain white light.

9. A semiconductor laser device according to claim 3, wherein an oscillation wavelength of the semiconductor laser element is in a red region and the light diffusing member comprises the wavelength conversion material, a wavelength of laser light emitted from the wavelength conversion material is in an ultraviolet region, and light obtained by diffusing light from the semiconductor laser element using the light diffusing member is mixed with light emitted from the wavelength conversion material.

10. A semiconductor laser device according to claim 3, wherein an oscillation wavelength of the semiconductor laser element is in an infrared region, a wavelength of laser light emitted from the wavelength conversion material is in a blue region, and light obtained by diffusing light emitted from the wavelength conversion material using the light diffusing member is mixed with light emitted from the fluorescent material.

11. A semiconductor laser device according to claim 1, wherein
   the semiconductor laser element further a plurality of light emission surfaces,
   a plurality of reflective members, a reflective surface of each reflective member being disposed facing a corresponding light emission surface of the semiconductor laser element, and
   each of a plurality of external resonance cavities is provided between and in direct contact with each of the plurality of light emission surfaces of the semiconductor laser element and the reflective surface of each of the plurality of reflective members.

12. A semiconductor laser device, comprising:
   a semiconductor laser element having a light emission surface;
   a reflective member having a reflective surface;
   a light diffusing member provided between the light emission surface and the reflective surface,
   wherein the light emission surface and the reflective surface face each other so that an external resonance cavity is provided therebetween,
   scattered light is emitted from the light diffusing member,
   wherein the semiconductor laser element further has at least one light emission surface,
   at least one reflective member is further provided, a reflective surface of each reflective member being disposed facing a corresponding light emission surface of the semiconductor laser element, a plurality of external resonance cavities are provided between the light emission surfaces of the semiconductor laser elements and the reflective surfaces of the reflective members;
wherein
the semiconductor laser element is in the shape of a hexagon when viewed from the top,
the light emission surfaces are disposed on six outer circumferential sides of the hexagon,
the reflective members each having the reflective surface provided thereon, the reflective surface facing the corresponding light emission surface, and
the external resonance cavities are provided between the light emission surfaces and the reflective surfaces.

13. A semiconductor laser device according to claim 12, wherein
the six external resonance cavities are paired with each pair of external resonance cavities facing each other, and
the light diffusing members corresponding to the three pairs of external resonance cavities emit three primary colors, i.e., red blue and green, respectively.

14. A semiconductor laser device, comprising:
a semiconductor laser element having a light emission surface;
a reflective member having a reflective surface;
a light diffusing member provided between the light emission surface and the reflective surface,
wherein the light emission surface and the reflective surface face each other so that an external resonance cavity is provided therebetween,
scattered light is emitted from the light diffusing member,
a second semiconductor laser element disposed opposite to the light diffusing member with respect to the reflective member, wherein
the reflective member also serves as a light emission surface for the second semiconductor laser element, and
the light emission surface of the first semiconductor laser element also functions as a reflective surface.

15. A semiconductor laser device according to claim 1, wherein
the light diffusing member is made of a resin containing a light scattering material, and
the resin seals the semiconductor laser element and the reflective member.

16. A semiconductor laser device according to claim 1, wherein the light diffusing member has a light emission surface in the shape of a lens.

17. A semiconductor laser device, comprising:
a semiconductor laser element having a light emission surface;
a reflective member having a reflective surface;
a light diffusing member provided between the light emission surface and the reflective surface,
wherein the light emission surface and the reflective surface face each other so that an external resonance cavity is provided therebetween,
scattered light is emitted from the light diffusing member, and
an external reflective member for reflecting light emitted from the light diffusing member in a predetermined direction.

18. A semiconductor laser device according to claim 17, wherein the external reflective member is a reflective condensing member for reflecting and condensing the light emitted from the light diffusing member.

19. A semiconductor laser device according to claim 1, further comprising a drive circuit for driving the semiconductor laser element.

20. A semiconductor laser device according to claim 19, wherein a power source voltage for the drive circuit is any one of DC 12 V, DC 24 V and AC 100 V.

21. A semiconductor laser device according to claim 19, wherein a power source terminal of the drive circuit is in the shape of a base.

22. A semiconductor laser device according to claim 1, wherein the light diffusing member is made of a resin containing a light scattering material and the light diffusing member is formed by applying the resin on the light emission surface of the semiconductor laser element.

23. A semiconductor laser device according to claim 1, wherein the light diffusing member is made of a resin containing a light scattering material and the light diffusing member is formed by applying the resin onto the reflective surface of the reflective member.

24. A semiconductor laser device according to claim 19, further comprising a light reception element for receiving light emitted from the light diffusing member, wherein
information about the light received by the light reception element is fed back to the drive circuit so that an intensity of the light emitted from the light diffusing member is controlled.

25. An apparatus for illumination, comprising a semiconductor laser device according to claim 1, wherein illumination is performed using light emitted from the semiconductor laser device.

* * * * *